United States Patent
Schlereth et al.

(10) Patent No.: US 9,379,161 B2
(45) Date of Patent: Jun. 28, 2016

(54) MONOLITHIC SEMICONDUCTOR CHIP ARRAY

(71) Applicant: OSRAM Opto Semiconductors GmbH, Regensburg (DE)

(72) Inventors: Thomas Schlereth, Regensburg (DE); Markus Kirsch, Brunn (DE); Christian Gaertner, Regensburg (DE); Tony Albrecht, Bad Abbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/767,245

(22) PCT Filed: Feb. 5, 2014

(86) PCT No.: PCT/EP2014/052246
§ 371 (c)(1),
(2) Date: Aug. 11, 2015

(87) PCT Pub. No.: WO2014/124853
PCT Pub. Date: Aug. 21, 2014

(65) Prior Publication Data
US 2015/0372054 A1    Dec. 24, 2015

(30) Foreign Application Priority Data

Feb. 12, 2013    (DE) .......................... 10 2013 101 367

(51) Int. Cl.
*H01L 27/15*    (2006.01)
*H01L 33/38*    (2010.01)
(Continued)

(52) U.S. Cl.
CPC .............. *H01L 27/156* (2013.01); *H01L 33/14* (2013.01); *H01L 33/382* (2013.01);
(Continued)

(58) Field of Classification Search
CPC ... H01L 27/156; H01L 33/385; H01L 33/486; H01L 33/62; H01L 33/14; H01L 33/382
USPC ........................................................ 257/88
See application file for complete search history.

(56) References Cited

U.S. PATENT DOCUMENTS 5,940,683 A    8/1999    Holm et al.
6,514,782 B1    2/2003    Wierer, Jr. et al.
(Continued)

FOREIGN PATENT DOCUMENTS

DE    102008011848 A1    9/2009
DE    102008051050 A1    4/2010
WO    2013/016346 A1    1/2013

*Primary Examiner* — Walter H Swanson
(74) *Attorney, Agent, or Firm* — McDermott Will & Emery LLP

(57) ABSTRACT

A semiconductor chip (10) is provided which comprises:
a semiconductor layer sequence (20) with a p-type semiconductor region (5) and an n-type semiconductor region (3),
a plurality of p-contacts (11a, 11b), which are connected electrically conductively with the p-type semiconductor region (5), and
a plurality of n-contacts (12a, 12b), which are connected electrically conductively with the n-type semiconductor region (3), wherein:
the p-contacts (11a, 11b) and the n-contacts (12a, 12b) are arranged on a rear side of the semiconductor chip (10),
the semiconductor chip (10) comprises a plurality of regions (21, 22) arranged adjacent one another, and
the regions (21, 22) each comprise one of the p-contacts (11a, 11b) and one of the n-contacts (12a, 12b).

17 Claims, 7 Drawing Sheets

Figure 1:
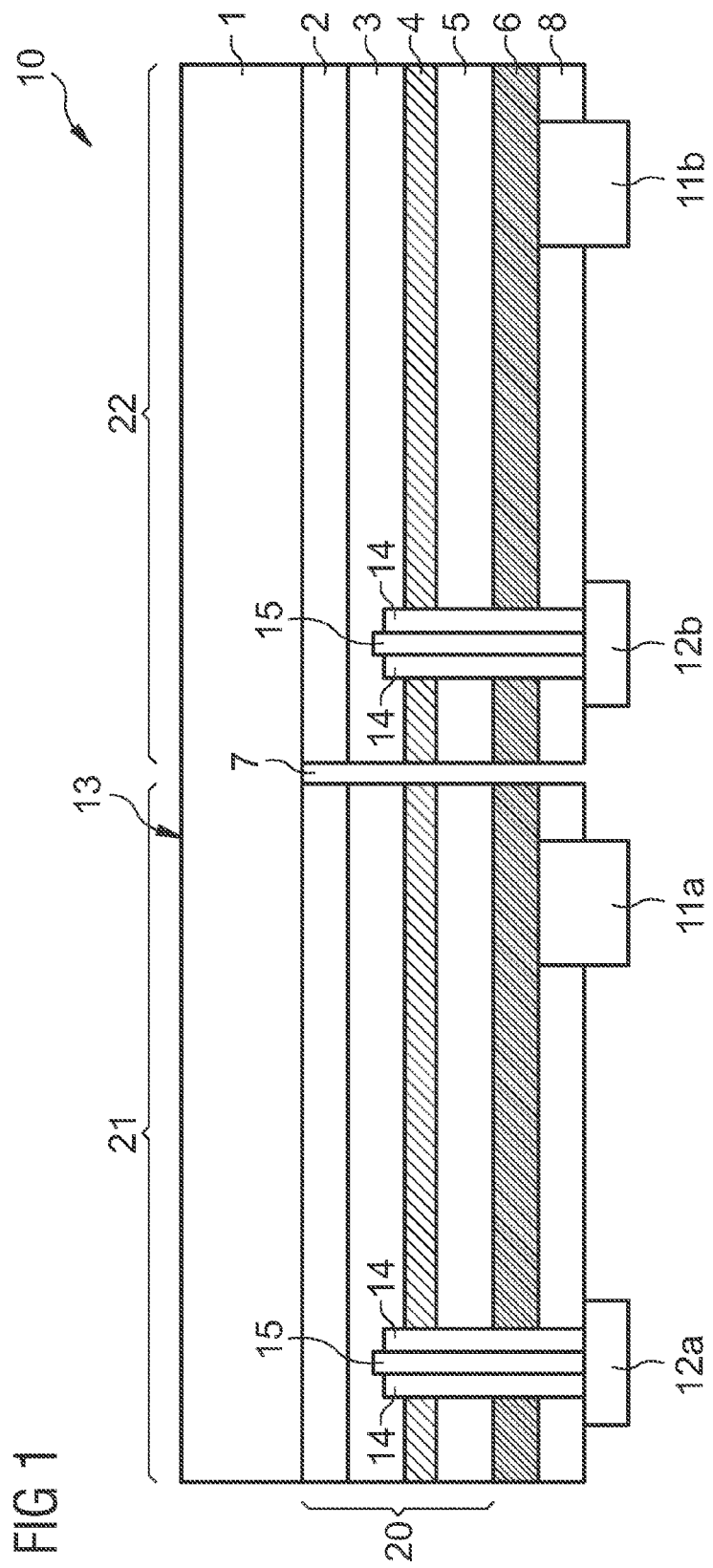

(51) Int. Cl.
*H01L 33/14* (2010.01)
*H01L 33/62* (2010.01)
*H01L 33/48* (2010.01)
*H01L 33/40* (2010.01)
*H01L 33/44* (2010.01)

(52) U.S. Cl.
CPC ............. *H01L 33/486* (2013.01); *H01L 33/62* (2013.01); *H01L 33/405* (2013.01); *H01L 33/44* (2013.01); *H01L 2924/0002* (2013.01)

(56) References Cited

U.S. PATENT DOCUMENTS

| | | | |
|---|---|---|---|
| 2007/0284598 A1* | 12/2007 | Shakuda | H01L 27/156 257/93 |
| 2010/0059733 A1 | 3/2010 | Shei et al. | |
| 2010/0308355 A1 | 12/2010 | Hsieh et al. | |
| 2011/0266579 A1 | 11/2011 | Nagai | |

* cited by examiner

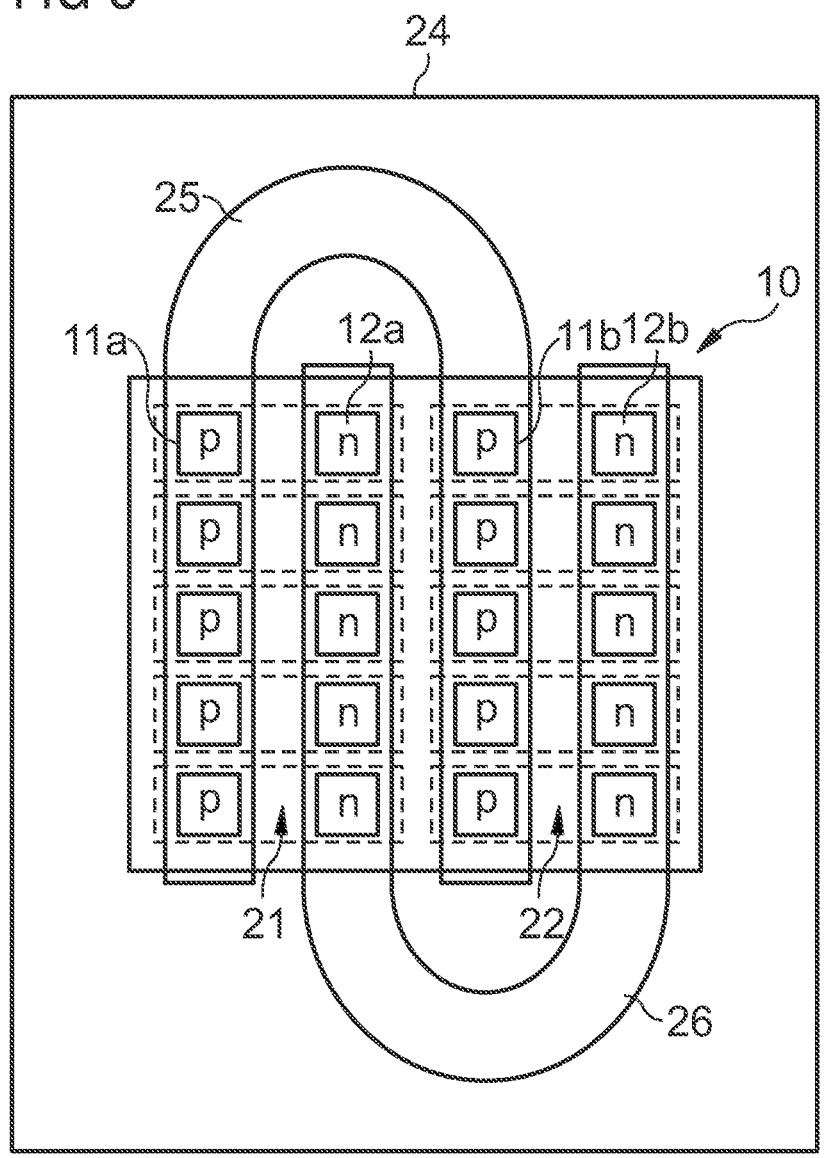

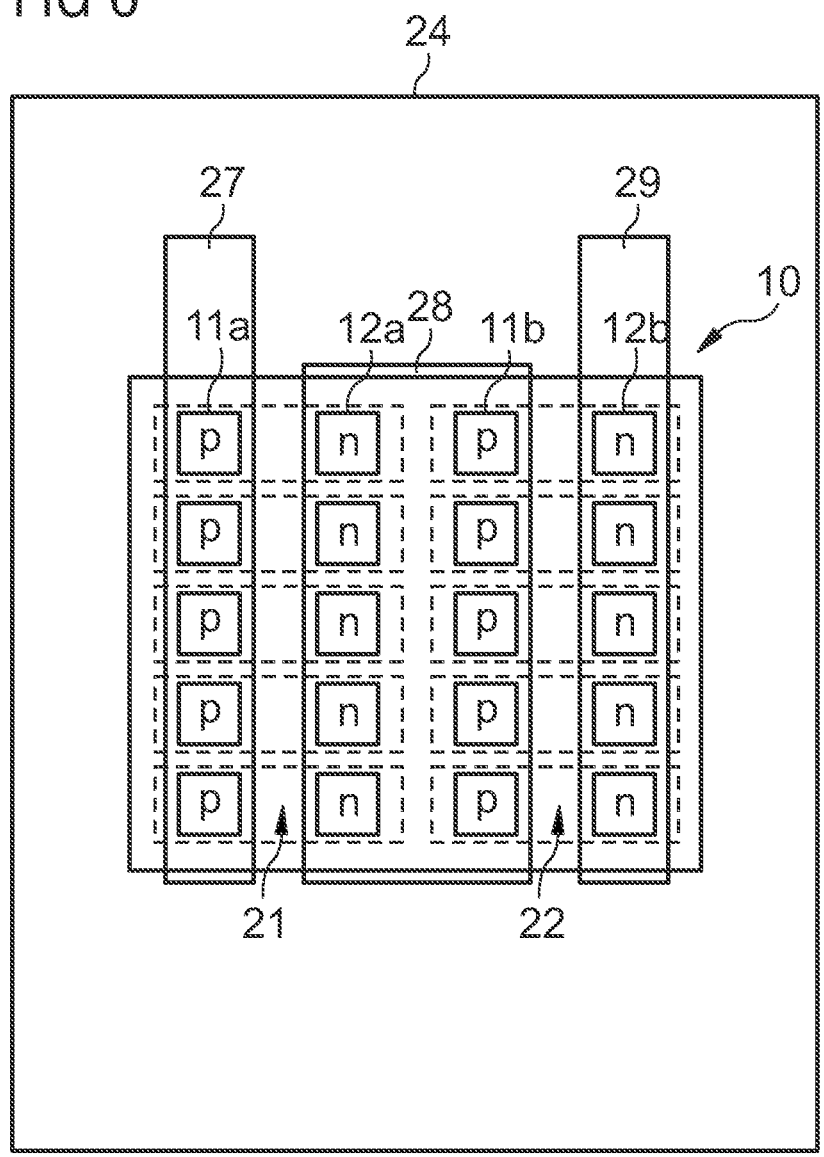

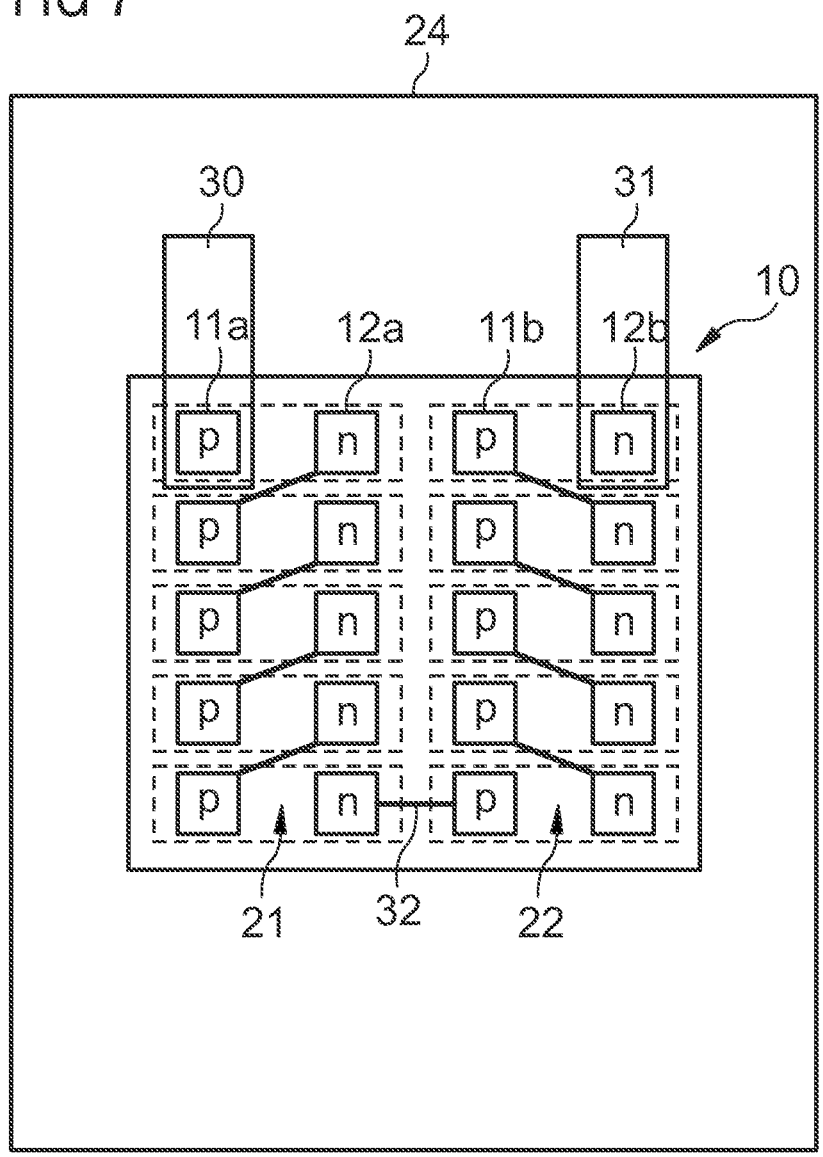

MONOLITHIC SEMICONDUCTOR CHIP ARRAY

The invention relates to a semiconductor chip, in particular an optoelectronic semiconductor chip.

This patent application claims priority from German patent application 10 2013 101 367.8, the disclosure content of which is hereby included by reference.

When producing semiconductor chips, in particular optoelectronic semiconductor chips such as for example LEDs, an epitaxial layer sequence is generally grown onto a substrate, wherein, by a sequence of patterning, plating and separation processes, the epitaxial layer sequence is singulated to produce individual semiconductor chips and provided with electrical contacts.

In many LED applications, for example for general lighting, in headlamps, in displays or in projection systems, a multiplicity of LED chips is often used, which are generally arranged in a predetermined arrangement adjacent one another. To produce such an arrangement, the multiplicity of LEDs is positioned and mounted on a common carrier.

The object of the present invention is to provide a semiconductor chip which comprises a plurality of individually drivable functional regions, which each have for example the function of an LED chip. The semiconductor chip is intended to be comparatively easy to produce in comparison with an arrangement of a multiplicity of individual semiconductor chips.

This object is achieved by a semiconductor chip according to independent claim 1. Advantageous configurations and further developments of the semiconductor chip are the subject matter of the dependent claims.

According to at least one configuration, the semiconductor chip comprises a semiconductor layer sequence with a p-type semiconductor region and an n-type semiconductor region. The semiconductor chip comprises a plurality of p-contacts, which are connected electrically conductively with the p-type semiconductor region. Furthermore, the semiconductor chip comprises a plurality of n-contacts, which are connected electrically conductively with the n-type semiconductor region. The p-contacts and the n-contacts are arranged on a rear side of the semiconductor chip. In particular, the semiconductor chip may be a "flip chip", in which both the p-contacts and the n-contacts are arranged on the rear side of the semiconductor chip, in particular on a mounting side of the semiconductor chip facing the carrier.

The semiconductor chip comprises a plurality of regions arranged adjacent one another, wherein the regions each comprise one of the p-contacts and one of the n-contacts. In particular, each of the regions in each case comprises precisely one of the p-contacts and precisely one of the n-contacts. In this way it is possible for each of the plurality of regions of the semiconductor chip arranged adjacent one another to be electrically contacted via the associated p-contact and the associated n-contact. Each of the regions of the semiconductor chip arranged adjacent one another thus advantageously forms a functional unit, which may have the function of an individual semiconductor chip such as for example an LED chip. The plurality of regions of the semiconductor chip arranged adjacent one another advantageously form a multiplicity of such functional regions, such that the semiconductor chip may advantageously have the function of a multiplicity of semiconductor chips arranged adjacent one another. In contrast to a multiplicity of separate semiconductor chips, this function is achieved with the semiconductor chip described herein with a single semiconductor chip subdivided into a plurality of regions, such that separate positioning and mounting of individual semiconductor chips on a carrier may advantageously be dispensed with. Rather, the entire semiconductor chip may advantageously be mounted in a single method step on a carrier, wherein the p-contacts and the n-contacts of the plurality of regions arranged adjacent one another are advantageously connected simultaneously with a contact structure of the carrier, for example conductor tracks.

The plurality of regions of the semiconductor chip arranged adjacent one another are preferably similar in structure. This means in particular that the plurality of regions arranged adjacent one another comprise the same layer sequence and the same layer thicknesses. Furthermore, the regions of similar structure advantageously each have the same base area and the same cross-sectional area. Preferably, the plurality of regions arranged adjacent one another are identical in structure within manufacturing tolerances. Furthermore, the p-contacts and n-contacts of the plurality of regions arranged adjacent one another advantageously each comprise the same structure and the same arrangement.

In a preferred configuration of the optoelectronic semiconductor chip, the plurality of regions comprise a grid arrangement. The plurality of regions arranged adjacent one another may in particular form a grid arrangement of m rows and n columns, wherein m and n are integers and preferably m, n≥2.

In a preferred configuration of the semiconductor chip, trenches are arranged between the plurality of regions, which trenches at least partly divide the semiconductor layer sequence. The trenches divide the semiconductor layer sequence preferably such that the p-type semiconductor regions and the n-type semiconductor regions of neighbouring regions arranged adjacent one another are in each case electrically isolated from one another. In this configuration, the p-contact and re-contact of each of the plurality of regions contact only the respective region, and are electrically insulated from the adjacent regions of the semiconductor chip. The regions arranged adjacent one another are therefore separately contactable.

In a preferred configuration of the semiconductor chip, at least two of the regions arranged adjacent one another are connected in series. This may proceed in particular in that the p-contact of one region and the n-contact of a further region are connected together for example by a contact surface or by a conductor track on a carrier of the semiconductor chip.

In a preferred configuration of the semiconductor chip, all of the regions arranged adjacent one another are connected in series. In this way, a so-called high voltage chip may be produced, which is operated with an operating voltage which corresponds to the sum of the forward voltages dropping over the individual regions.

In a further configuration of the semiconductor chip, at least two of the regions arranged adjacent one another are connected in parallel. This may in particular proceed in that the p-contacts of two adjacent regions are connected together electrically, and also the n-contacts of the regions arranged adjacent one another are connected together electrically.

In a further preferred configuration, all the regions of the semiconductor chip arranged adjacent one another are connected in parallel.

The semiconductor chip preferably comprises a carrier which comprises contact surfaces and/or conductor tracks. By means of the contact surfaces and/or the conductor tracks on the carrier, it is possible in particular to connect at least two or more regions in series or in parallel.

In a preferred configuration, the semiconductor chip comprises a growth substrate, wherein the plurality of regions arranged adjacent one another are connected together by the growth substrate. The semiconductor layer sequence is preferably grown epitaxially on the growth substrate.

In a preferred configuration, the semiconductor chip is an optoelectronic semiconductor chip. The optoelectronic semiconductor chip advantageously contains a radiation-emitting or a radiation-detecting active layer. In particular, the semiconductor chip may be an LED chip.

According to one configuration, a radiation-emitting active layer is arranged between the n-type semiconductor region and the p-type semiconductor region, wherein a radiation exit face lies opposite the rear side of the semiconductor chip. The radiation generated by the radiation-emitting active layer is thus emitted by a surface of the semiconductor chip which lies opposite the contacts on the rear side of the semiconductor chip. The radiation exit face of the semiconductor chip may therefore advantageously be free of electrical contacts.

According to a preferred configuration, a mirror layer is arranged on a side of the semiconductor layer sequence remote from the radiation exit face. The mirror layer may in particular be arranged between the electrical contacts on the rear side of the semiconductor chip and the semiconductor layer sequence. The mirror layer has the advantage that radiation emitted by the radiation-emitting active layer, which is emitted towards the rear side of the semiconductor chip, is deflected towards the radiation exit face and the radiant yield of the semiconductor chip is thus increased.

The p-contacts of the regions are preferably each connected with the p-type semiconductor region in that the mirror layer is electrically conductive and adjoins the p-type semiconductor region, wherein the p-contact is connected electrically conductively with the mirror layer. In this configuration, in the plurality of regions the n-contact is in each case advantageously electrically insulated from the mirror layer by means of an electrically insulating layer.

The n-contacts of the regions are connected electrically preferably by means of at least one through-via, which passes through the mirror layer and the semiconductor layer sequence, with the n-type semiconductor region.

In one configuration, a current spreading layer is arranged between the mirror layer and the n-contacts, which current spreading layer is electrically conductively connected with the n-contacts, wherein the current spreading layer is insulated from the mirror layer by means of a first electrically insulating layer and from the p-contacts by means of a second electrically insulating layer.

Furthermore, in this configuration the n-contacts are advantageously in each case electrically connected with the n-type semiconductor region by means of a plurality of through-vias, which each pass from the current spreading layer through the mirror layer and the semiconductor layer sequence. The current spreading layer and the plurality of through-vias advantageously ensure that the n-contact is connected electrically at a plurality of points with the n-type semiconductor region. In this way, the homogeneity of the current flow in the semiconductor layer sequence is advantageously improved.

For the p-contact the mirror layer may advantageously function as a current spreading layer, wherein the mirror layer preferably comprises a metal or a metal alloy such as for example aluminium or silver. Aluminium and silver are distinguished both by high electrical conductivity and by high reflection.

The optoelectronic semiconductor chip is advantageously a surface-mountable semiconductor chip. In particular, the p-contacts and the n-contacts lie exposed on the rear side of the optoelectronic semiconductor chip and may thus be contacted from the outside if the semiconductor chip is mounted on a surface. The p-contacts and the n-contacts are advantageously arranged flush with one another. In other words, the contact surfaces of the p-contacts and n-contacts remote from the rear side of the semiconductor chip lie in a plane, such that the semiconductor chip is mountable with the contact surfaces on a planar surface. The semiconductor chip may for example be mounted on a printed circuit board, wherein the exposed p-contacts and n-contacts are connected with conductor tracks of the printed circuit board. The optoelectronic semiconductor chip may in particular be mounted in such a way that the substrate points upwards and thus the direction of radiation is the opposite of the growth direction of the semiconductor layer sequence. Such an optoelectronic semiconductor chip is also known as a flip chip.

Figure 2:
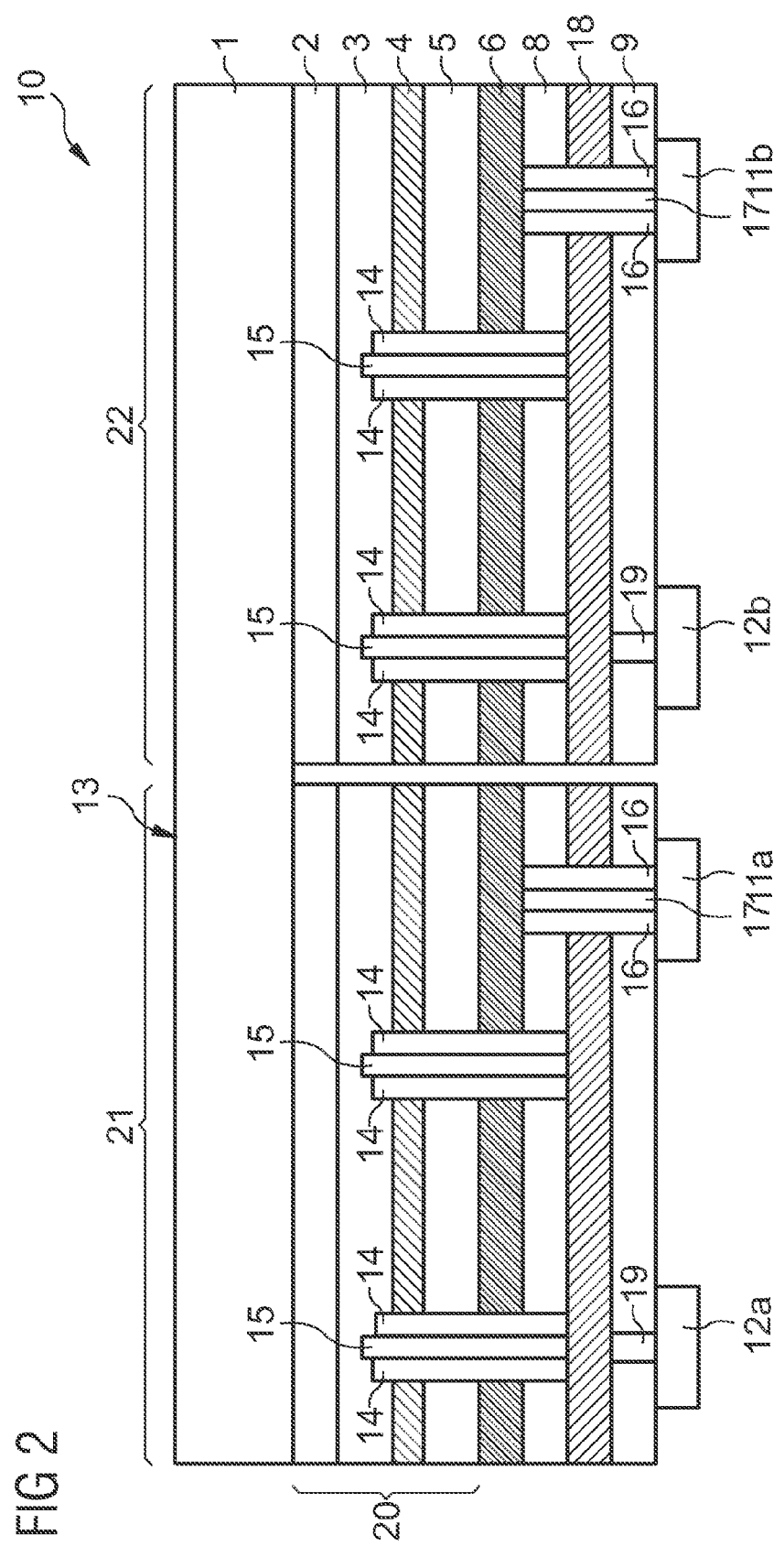
Figure 3A:
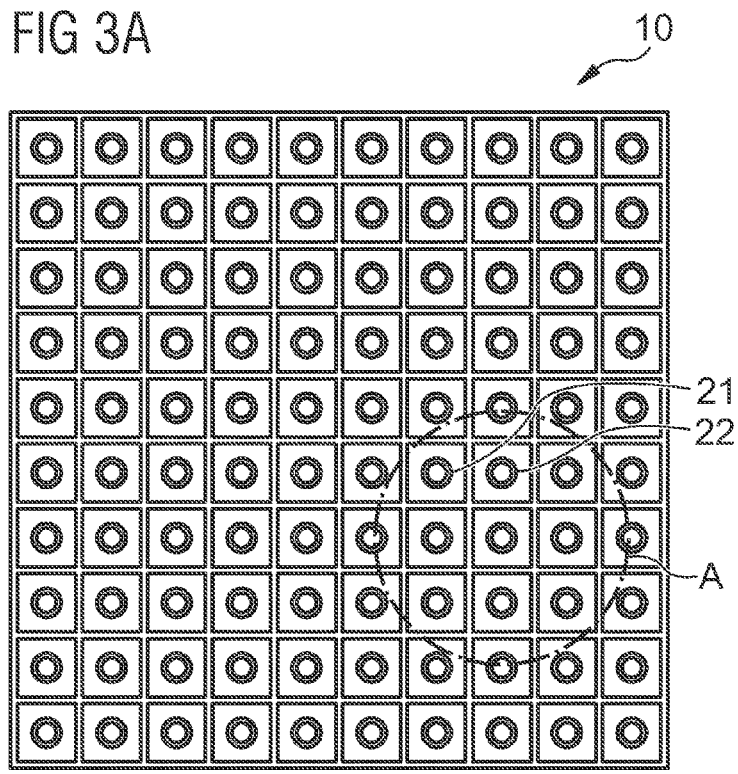
Figure 3B:
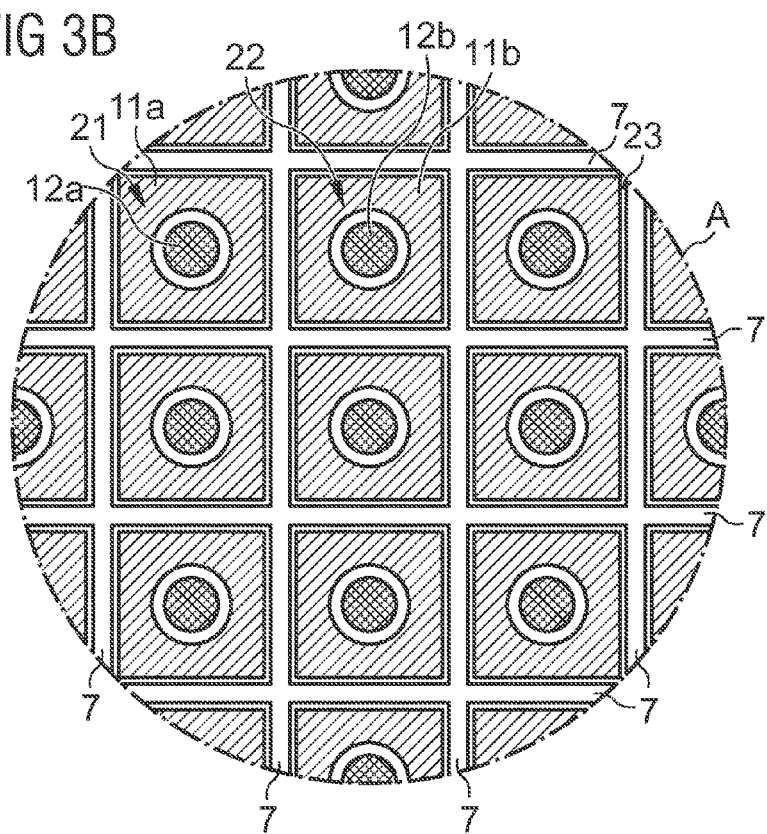
Figure 4A:
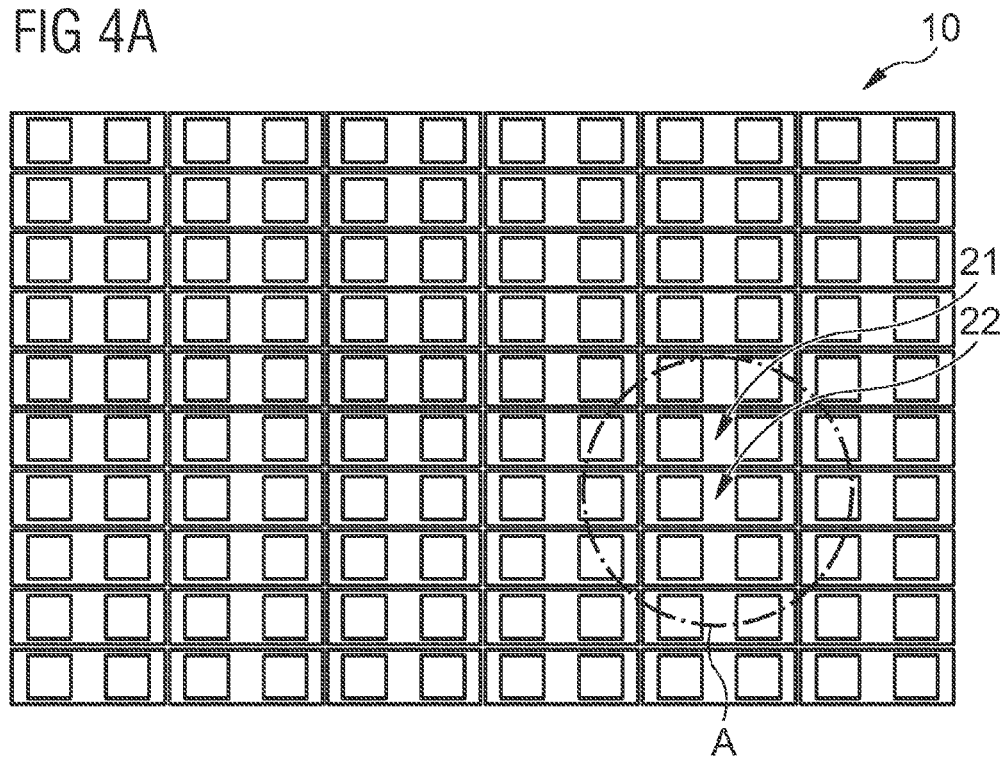
Figure 4B:
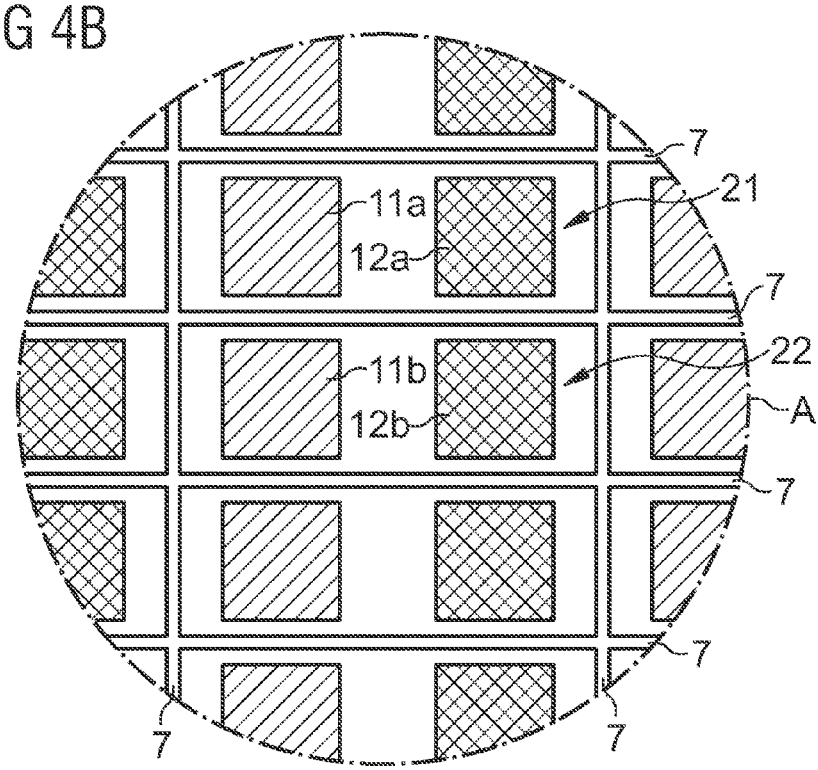

The invention is explained in greater detail below with reference to exemplary embodiments in conjunction with FIGS. 1 to 7, in which:

FIG. 1 is a schematic representation of a cross-section through an optoelectronic semiconductor chip according to a first exemplary embodiment, FIG. 2 is a schematic representation of a cross-section through an optoelectronic semiconductor chip according to a further exemplary embodiment, FIGS. 3A and 3B are schematic representations of an optoelectronic semiconductor chip according to a further exemplary embodiment in a view from below, FIGS. 4A and 4B are schematic representations of an optoelectronic semiconductor chip according to a further exemplary embodiment in a view from below, FIG. 5 is a schematic representation of a chip carrier for an optoelectronic semiconductor chip according to one exemplary embodiment, FIG. 6 is a schematic representation of a chip carrier for an optoelectronic semiconductor chip according to one exemplary embodiment, and FIG. 7 is a schematic representation of a chip carrier for an optoelectronic semiconductor chip according to a further exemplary embodiment.

In the figures identical or equivalently acting components are in each case denoted with the same reference numerals. The components illustrated and the size ratios of the components to one another should not be regarded as to scale.

In the exemplary embodiment of the semiconductor chip illustrated in FIG. 1, said chip is an optoelectronic semiconductor chip, in particular an LED chip.

The optoelectronic semiconductor chip 10 comprises a semiconductor layer sequence 20. The semiconductor layer sequence 20 is preferably based on a III-V compound semiconductor material, in particular on an arsenide, nitride- or phosphide compound semiconductor material. For example the semiconductor layer sequence 20 may contain $In_xAl_yGa_{1-x-y}N$, $In_xAl_yGa_{1-x-y}P$ or $In_xAl_yGa_{1-x-y}As$, in each case with $0 \leq x \leq 1$, $0 \leq y \leq 1$ and $x+y \leq 1$. In this case, the III-V compound semiconductor material does not absolutely have to comprise a mathematically exact composition according to one of the above formulae. Instead, it may comprise one or more dopants and additional constituents which do not substantially modify the physical characteristics of the material. For simplicity's sake, however, the above formulae include only the fundamental constituents of the crystal lattice, even if these may in part be replaced by small quantities of further substances.

The optoelectronic semiconductor chip 10 comprises a substrate 1 on which the semiconductor layer sequence 20 may in particular be epitaxially grown. The substrate 1 is thus advantageously a growth substrate. The semiconductor layer sequence 20 comprises an n-type semiconductor region 3, a p-type semiconductor region 5 and an active layer 4 arranged between the n-type semiconductor region 3 and the p-type semiconductor region 5. The designations p-type semiconductor region and n-type semiconductor region do not rule out the possibility of one or more undoped layers being contained therein.

The active layer 4 of the optoelectronic semiconductor chip 10 is an active layer 4 suitable for the emission of radiation. The active layer 4 may for example take the form of a pn-junction, of a double heterostructure, of a single quantum well structure or of a multiple quantum well structure. One or more buffer layers 2 may be arranged between the substrate 1 and the n-type semiconductor region 3.

The radiation exit face 13 of the optoelectronic semiconductor chip 10 is formed by a surface of the substrate 1 remote from the semiconductor layer sequence 20. The optoelectronic semiconductor chip 10 thus in particular emits radiation through the substrate 1. The substrate 1 is therefore advantageously a transparent substrate, which may in particular comprise silicon, silicon carbide or sapphire.

A mirror layer 6 is arranged on the opposite side of the semiconductor layer sequence 20 from the radiation exit face 13. The mirror layer 6 reflects towards the radiation exit face 13 radiation emitted by the active layer 4 towards a rear side of the semiconductor chip 10 opposite the radiation exit face 13. This increases the radiant yield of the optoelectronic semiconductor chip 10. The mirror layer 6 is preferably formed of an electrically conductive material. In particular, the mirror layer 6 may contain a metal or a metal alloy. Preferably, the mirror layer contains aluminium, silver, gold or platinum or consists thereof. These materials are distinguished on the one hand by good electrical conductivity and on the other hand by high reflectivity.

In the semiconductor layer sequence 20 the semiconductor layers, when viewed in the beam direction, are arranged the opposite way round from the original growth direction, wherein the p-type semiconductor region 5, the active layer 4 and n-type semiconductor region 3 succeed one another in the beam direction directed from the mirror layer 6 to the radiation exit face 13. The sequence of the semiconductor regions 3, 5 in the beam direction is therefore the reverse of the sequence during epitaxial growth, in which conventionally firstly the n-type semiconductor region 3, then the active layer 4 and thereafter the p-type semiconductor region 5 are grown.

For electrical contacting of the optoelectronic semiconductor chip 10, a plurality of p-contacts 11a, 11b and a plurality of n-contacts 12a, 12b are arranged on a side of the mirror layer 6 remote from the semiconductor layer sequence 20.

The semiconductor layer sequence 20 comprises two regions 21, 22 arranged adjacent one another, wherein the regions 21, 22 arranged adjacent one another each comprise one of the p-contacts 11a, 11b and one of the n-contacts 12a, 12b. The first region 21 is contactable via the p-contact 11a and the n-contact 12a and the second region 22 via the p-contact 11b and the n-contact 12b.

The regions 21, 22 are separated from one another for example by a trench 7. The trench 7 divides the semiconductor layer sequence 20 in particular such that the n-type semiconductor region 3, the active layer 4 and the p-type semiconductor region 5 of the regions 21, 22 arranged adjacent one another are in each case not connected directly together electrically.

The regions 21, 22 of the semiconductor chip 10 arranged adjacent one another preferably do not differ from one another in structure. In particular, the regions arranged adjacent one another have the same cross-section and the same base area. Furthermore, the electrical contacts 11a, 12a, 11b, 12b of the regions 21, 22 each have the same dimensions and the same arrangement. The regions 21, 22 arranged adjacent one another are thus advantageously congruent with one another.

In the regions 21, 22 the p-contact 11a, 11b is in each case electrically conductively connected with the p-type semiconductor region 5. This may for example be achieved in that the mirror layer 6 adjoins the p-type semiconductor region and the p-contact 11a, 11b is electrically conductively connected with the mirror layer 6, for example adjoins the mirror layer 6.

The n-contact 12a, 12b of the regions 21, 22 is in each case electrically conductively connected with the n-type semiconductor region 3. This may in particular be achieved in that the n-contact 12a, 12b is electrically conductively connected with the n-type semiconductor region 3 in each case by means of a through-via 15, which passes through the mirror layer 6 and the semiconductor layer sequence 20 as far as into the n-type semiconductor region 3.

The through-via 15 is electrically insulated with electrically insulating layers 14 from the mirror layer 6, from the p-type semiconductor region 5 and from the active layer 4 of the semiconductor layer sequence 20. On the side of the mirror layer 6 remote from the semiconductor layer sequence 20, an electrically insulating layer 8 is provided in order to insulate the n-contacts 12a, 12b from the mirror layer 6.

The electrical contacts 11a, 11b, 12a, 12b of the optoelectronic semiconductor chip 10 are in each case rear side contacts, which are arranged on a rear side of the semiconductor chip 10 opposite the radiation exit face 13. The radiation exit face 13 is therefore advantageously free of electrical contact layers. The surface of the substrate 1 serving as a radiation exit face 13, which surface is remote from the semiconductor layer sequence 20, may for example be provided with roughening, an outcoupling pattern or an antireflection coating.

The regions 21, 22 arranged adjacent one another each form a functional unit of the semiconductor chip 10. In the exemplary embodiment the regions 21, 22 each form a separately contactable radiation-emitting region of the optoelectronic semiconductor chip. To simplify the representation, FIG. 1 shows only two regions 21, 22 arranged adjacent one another. The semiconductor chip 10 may however comprise a multiplicity of such regions 21, 22 in any desired one- or two-dimensional arrangement.

In particular, the regions 21, 22 arranged adjacent one another may form a grid arrangement of similar functional units. In this case, the regions 21, 22 for example form a grid arrangement with m rows and n columns, wherein m, n≥2.

The optoelectronic semiconductor chip 10 is advantageously surface-mountable. In particular, the p-contacts 11a, 11b and n-contacts 12a, 12b lie exposed on the rear side of the optoelectronic semiconductor chip and may thus be contacted from outside if the semiconductor chip is mounted on a surface. The p-contacts 11a, 11b and the n-contacts 12a, 12b are advantageously flush with one another. In other words, the contact surfaces of the p-contacts 11a, 11b and n-contacts 12a, 12b remote from the rear side of the semiconductor chip lie in a plane, such that the semiconductor chip is mountable with the contact surfaces on a planar surface. The semiconductor chip may for example be mounted on a printed circuit board, wherein the exposed p-contacts 11a, 11b and n-contacts 12a, 12b are connected with conductor tracks of the printed circuit board. The optoelectronic semiconductor chip 10 may in particular be mounted in such a way that the substrate 1 points upwards and thus the direction of radiation is the opposite of the growth direction of the semiconductor layer sequence 20. Such an optoelectronic semiconductor chip 10 is also known as a flip chip.

The optoelectronic semiconductor chip 10 may in particular be mounted on a carrier, which comprises contact patterns such as for example conductor tracks. By means of the contact patterns on the carrier, the p-contacts 11a, 11b and the n-contacts 12a, 12b of the regions 21, 22 are electrically connected. In particular it is possible for the regions 21, 22 to be connected in parallel or in series by means of suitable contact patterns on the carrier.

FIG. 2 shows a second exemplary embodiment of the optoelectronic semiconductor chip 10 schematically in cross-section.

The structure of the semiconductor layer sequence 20 arranged on the substrate 1 corresponds to the first exemplary embodiment. A difference from the first exemplary embodiment shown in FIG. 1 consists in the fact that the n-contacts 12a, 12b of the regions 21, 22 are in each case not directly connected with the n-type semiconductor region 3 by means of the through-vias 15. Rather, in the second exemplary embodiment the n-contacts 12a, 12b are each connected with a current spreading layer 18 by means of an electrically conductive connection layer 19.

The current spreading layer 18 is arranged on the opposite side of the mirror layer 6 from the semiconductor layer sequence 20. The current spreading layer 18 is here insulated from the mirror layer 6 by means of the electrically insulating layer 8. Two through-vias 15 advantageously extend from the current spreading layer 18 in each case through the mirror layer 6 and the semiconductor layer sequence 20 as far as the n-type semiconductor region 3. The through-vias 15 are here in each case electrically insulated from the mirror layer 6, from the p-type semiconductor region 5 and from the active layer 4 by means of electrically insulating layers 14. Because the optoelectronic semiconductor chip 10 comprises a current spreading layer 18 connected to the n-contacts 12a, 12b, from which layer a plurality of through-vias 15 pass as far as into the n-type semiconductor region 3, particularly homogeneous current input into the active layer 4 is achieved in each case in the regions 21, 22.

As in the first exemplary embodiment, the p-contacts 11a, 11b are in each case electrically conductively connected with the mirror layer 6, which adjoins the p-type semiconductor region 5. Since in the second exemplary embodiment the current spreading layer 18 is arranged between the mirror layer 6 and the electrical contacts 11a, 11b, 12a, 12b, the p-contacts 11a, 11b are advantageously in each case electrically conductively connected with the mirror layer 6 by means of a through-via 17, which is insulated with electrically insulating layers 16 from the current spreading layer 18. The p-contacts 11a, 11b are insulated electrically with a further electrically insulating layer 9 from the current spreading layer 18.

Further advantageous configurations of the second exemplary embodiment are revealed by the description of the first exemplary embodiment and vice versa.

In the exemplary embodiments of the optoelectronic semiconductor chip 10 according to FIGS. 1 and 2, in each case only two regions 21, 22 arranged adjacent one another are shown, to simplify the representation. The optoelectronic semiconductor chip 10 may comprise a multiplicity of such regions 21, 22 arranged adjacent one another, wherein the regions 21, 22 arranged adjacent one another may in particular have a grid arrangement.

FIG. 3A shows a view from below of an exemplary embodiment of the optoelectronic semiconductor chip 10, in which the optoelectronic semiconductor chip 10 comprises a total of one hundred regions 21, 22 arranged adjacent one another, which form a grid arrangement with ten rows and ten columns. FIG. 3B shows an enlarged view of the detail A marked in FIG. 3A.

The semiconductor chip 10 may have a multilayer structure as in the exemplary embodiment shown in FIG. 1, which is therefore not explained again in greater detail. As in the exemplary embodiment shown in FIG. 1, the regions 21, 22 arranged adjacent one another are in each case separated from one another by trenches 7. The side faces of the regions 21, 22 facing the trenches 7 may be provided for example with a passivation layer 23.

The geometric arrangement of the p-contacts 11a, 11b and the n-contacts 12a, 12b in the exemplary embodiment of FIG. 3 differs from the exemplary embodiment of FIG. 1. The n-contacts 12a, 12b are in each case circular and arranged in the centre of the regions 21, 22. The p-contacts 11a, 11b are directed spacedly around the n-contacts 12a, 12b and extend as far as the side faces of the square regions 21, 22. The regions 21, 22 arranged adjacent one another are identical in structure and in each case form a functional unit of the optoelectronic semiconductor chip 10. The number of functional units which are formed by the regions 21, 22 may be adapted to the specified application during production of the optoelectronic semiconductor chip 10 and the optoelectronic semiconductor chip 10 may be scaled in size by the selection of the number of functional units in the rows and columns of the grid arrangement.

A further exemplary embodiment of the optoelectronic semiconductor chip 10 is shown in a view from below in FIGS. 4A and 4B. As shown in FIG. 4A, the optoelectronic semiconductor chip 10 comprises a total of sixty regions 21, 22 arranged adjacent one another in ten rows and six columns. The regions 21, 22, which each form a functional unit of the optoelectronic semiconductor chip 10, are rectangular in shape in this exemplary embodiment.

FIG. 4B shows an enlarged view of the detail A marked in FIG. 4A. The rectangular regions 21, 22 arranged adjacent one another are in each case separated from one another by trenches 7 as in the previous exemplary embodiment. The regions 21, 22 arranged adjacent one another are constructed in this exemplary embodiment as in the exemplary embodiment shown in FIG. 2. In the view from below, the p-contact 11a, 11b and re-contact 12a, 12b are in each case visible. The optoelectronic semiconductor chip 10 may be scaled in size during production by a suitable selection of the number of regions 21, 22 arranged adjacent one another.

In the exemplary embodiments of the optoelectronic semiconductor chip described herein, the regions 21, 22 are advantageously joined together in each case via a common growth substrate. This means that the trenches 7 do not at least completely divide the growth substrate of the semiconductor layer sequence, which forms the multiplicity of regions 21, 22 arranged adjacent one another.

The optoelectronic semiconductor chips 10 described in the exemplary embodiments have the advantage over a grid arrangement of a multiplicity of previously singulated semiconductor chips that they may be positioned and soldered on a carrier in an individual method step. In this way, a grid arrangement of a multiplicity of light-emitting regions 21, 22 arranged adjacent one another may advantageously be produced with comparatively little production effort.

The plurality of regions 21, 22 arranged adjacent one another of the optoelectronic semiconductor chips 10 may be electrically interconnected in a different way by mounting the optoelectronic semiconductor chip on a carrier provided with suitable contact surfaces. Examples of suitable contact structures for producing different circuit arrangements are shown in subsequent FIGS. 5 to 7.

FIG. 5 shows a plan view onto a carrier 24 for the optoelectronic semiconductor chip with contact surfaces 25, 26. The carrier is provided for an optoelectronic semiconductor chip 10 with ten regions 21, 22 arranged adjacent one another, in five rows and two columns. The rectangles shown in dashed lines symbolise the outlines of the regions 21, 22, which are connected in each case with their p-contacts 11a, 11b and their n-contacts 12a, 12b to the contact surfaces 25, 26.

The exemplary embodiment comprises two U-shaped contact surfaces 25, 26, wherein the p-contacts 11a of the regions 21 of the first column and the p-contacts 11b of the adjacent regions 22 of the second column are arranged on the legs of a first contact surface 25. The n-contacts 12a of the first column and the n-contacts 12b of the adjacent regions 22 of the second column are arranged on the legs of the second contact surface 26. Provision may for example be made for each of the two U-shaped contact surfaces 25, 26 to be contacted by means of a wire lead. With the illustrated contact surfaces 25, 26 on the carrier 24, a parallel connection of the ten regions 21, 22 of the semiconductor chip 10 is produced. The regions 21, 22 are configured for example as in the exemplary embodiments of FIGS. 2 and 4.

FIG. 6 shows a further exemplary embodiment of a carrier 24 with contact surfaces 27, 28, 29, which are provided as in the exemplary embodiment of FIG. 5 for an optoelectronic semiconductor chip 10 with ten regions 21, 22 arranged in five rows and two columns. A first strip-form contact surface 27 connects together the p-contacts 11a of the regions 21 of the first column. The n-contacts 12a of the regions 21 of the first column and the p-contacts 11b of the regions 22 of the second column are connected together by a contact surface 28. A further strip-form contact surface 29 connects together the n-contacts 12b of the regions 22 of the second column. With this contact pattern 27, 28, 29, it is ensured that the regions 21 of the first column are connected in parallel, and also the regions 22 of the second column are connected in parallel. The five regions 21 of the first column and the five regions 22 of the second column are connected together in series. The two strip-form contact surfaces 27, 29 may for example in each case be provided with a wire lead.

FIG. 7 shows a further exemplary embodiment of a carrier 24 suitable for the optoelectronic semiconductor chip 10. As in the previous two exemplary embodiments, the carrier 24 for an optoelectronic semiconductor chip 10 is provided with ten regions 21, 22, arranged in five rows and two columns. The p-contact 11a of the region 21 of the first row and the first column, and the n-contact 12b of the region 22 of the first row and second column are in each case contacted with a strip-form contact surface 30, 31. Furthermore, a p-contact 11a, 11b is in each case connected with an n-contact 12a, 12b of an adjacent region 21, 22 in such a way that all ten regions 21, 22 are connected in series. The connection between the p-contacts 11a, 11b and the adjacent n-contacts 12a, 12b may be effected for example by conductor tracks 32.

The three exemplary embodiments of a carrier with contact surfaces in FIGS. 5, 6 and 7 make clear that different electrical circuit arrangements of light-emitting regions may be produced with an optoelectronic semiconductor chip 10 comprising for example ten regions 21, 22 arranged adjacent one another in five rows and two columns.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor chip, comprising:
a semiconductor layer sequence with a p-type semiconductor region and an n-type semiconductor region;
a plurality of p-contacts, which are connected electrically conductively with the p-type semiconductor region; and
a plurality of n-contacts, which are connected electrically conductively with the n-type semiconductor region,
wherein the p-contacts and the n-contacts are arranged on a rear side of the optoelectronic semiconductor chip,
wherein the optoelectronic semiconductor chip comprises a plurality of regions arranged adjacent one another,
wherein the regions each comprise one of the p-contacts and one of the n-contacts,
wherein a mirror layer is arranged on a side of the semiconductor layer sequence remote from a radiation exit face,
wherein a current spreading layer is arranged between the mirror layer and the n-contacts, which current spreading layer is electrically conductively connected with the n-contacts, and
wherein the current spreading layer is insulated from the mirror layer by means of a first electrically insulating layer and from the p-contacts by means of a second electrically insulating layer.

2. The optoelectronic semiconductor chip according to claim 1, wherein the plurality of regions are similar in structure.

3. The optoelectronic semiconductor chip according to claim 1, wherein the plurality of regions comprise a grid arrangement.

4. The optoelectronic semiconductor chip according to claim 1, wherein trenches are arranged between the plurality of regions, which trenches divide the semiconductor layer sequence.

5. The optoelectronic semiconductor chip according to claim 1, wherein at least two of the regions are connected in series.

6. The optoelectronic semiconductor chip according to claim 5, wherein all the regions of the semiconductor chip are connected in series.

7. The optoelectronic semiconductor chip according to claim 1, wherein at least two of the regions are connected in parallel.

8. The optoelectronic semiconductor chip according to claim 7, wherein all the regions of the optoelectronic semiconductor chip are connected in parallel.

9. The optoelectronic semiconductor chip according to claim 7, wherein the optoelectronic semiconductor chip comprises a carrier, and the at least two regions are connected in parallel by means of contact surfaces or conductor tracks arranged on the carrier.

10. The optoelectronic semiconductor chip according to claim 1, wherein the semiconductor layer sequence comprises a growth substrate, and the plurality of regions arranged adjacent one another are joined together by the growth substrate.

11. The optoelectronic semiconductor chip according to claim 1, wherein a radiation-emitting active layer is arranged between the n-type semiconductor region and the p-type semiconductor region, wherein a radiation exit face is opposite the rear side of the semiconductor chip.

12. The optoelectronic semiconductor chip according to claim 1, wherein the n-contacts are in each case electrically connected with the n-type semiconductor region by means of a plurality of through-vias, which each pass from the current spreading layer through the mirror layer and the semiconductor layer sequence.

13. The optoelectronic semiconductor chip according to claim 1, wherein the semiconductor chip is surface-mountable and the p-contacts and the n-contacts are arranged flush relative to one another.

14. The optoelectronic semiconductor chip according to claim 5, wherein the optoelectronic semiconductor chip comprises a carrier, and the at least two regions are connected in series by means of contact surfaces or conductor tracks arranged on the carrier.

15. An optoelectronic semiconductor chip, comprising:
a semiconductor layer sequence with a p-type semiconductor region and an n-type semiconductor region;
a plurality of p-contacts, which are connected electrically conductively with the p-type semiconductor region; and
a plurality of n-contacts, which are connected electrically conductively with the n-type semiconductor region,
wherein the optoelectronic semiconductor chip comprises a plurality of regions arranged adjacent one another,
wherein the regions each comprise one of the p-contacts and one of the n-contacts,
wherein a mirror layer is arranged on a side of the semiconductor layer sequence remote from a radiation exit face,
wherein a current spreading layer is arranged between the mirror layer and the n-contacts, which current spreading layer is electrically conductively connected with the n-contacts,
wherein the current spreading layer is insulated from the mirror layer by means of a first electrically insulating layer and from the p-contacts by means of a second electrically insulating layer, and
wherein the n-contacts are in each case electrically connected with the n-type semiconductor region by means of a plurality of through-vias, which each pass from the current spreading layer through the mirror layer and the semiconductor layer sequence.

16. The optoelectronic semiconductor chip according to claim 15, wherein the plurality of regions are similar in structure.

17. The optoelectronic semiconductor chip according to claim 15, wherein the plurality of regions comprise a grid arrangement.

* * * * *